United States Patent [19]

Potash

[11] Patent Number: 4,777,615

[45] Date of Patent: Oct. 11, 1988

[54] BACKPLANE STRUCTURE FOR A COMPUTER SUPERPOSITIONING SCALAR AND VECTOR OPERATIONS

[76] Inventor: Hanan Potash, 6923 Paseo Laredo, La Jolla, Calif. 92037

[21] Appl. No.: 834,942

[22] Filed: Feb. 28, 1986

[51] Int. Cl.⁴ .............................................. H05K 1/14
[52] U.S. Cl. ................... 364/900; 361/413; 361/393; 439/377
[58] Field of Search ... 364/200 MS File, 900 MS File, 364/900; 361/393, 413, 415, 399, 401, 395

[56] References Cited

U.S. PATENT DOCUMENTS

| | | | |
|---|---|---|---|
| 3,832,603 | 8/1974 | Cray et al. | 317/101 D |
| 4,120,021 | 10/1978 | Roush | 361/388 |
| 4,320,438 | 3/1982 | Ibrahim et al. | 361/401 |
| 4,327,835 | 5/1982 | Leger | 361/399 |
| 4,401,351 | 8/1983 | Record | 361/393 |
| 4,466,255 | 8/1984 | Roush | 62/259.2 |
| 4,470,100 | 9/1984 | Rebaudo et al. | 361/415 |
| 4,472,765 | 9/1984 | Hughes | 361/393 |
| 4,477,862 | 10/1984 | Gonzales | 361/393 |
| 4,486,816 | 12/1984 | Hope | 361/413 |
| 4,511,950 | 4/1985 | Bunner et al. | 361/415 |
| 4,514,784 | 4/1985 | Williams et al. | 361/386 |
| 4,519,016 | 5/1985 | Bradley et al. | 361/415 |
| 4,532,576 | 7/1985 | Reimer | 361/415 |
| 4,574,331 | 3/1986 | Smolley | 361/393 |
| 4,592,610 | 6/1986 | Bowls | 361/415 |
| 4,638,424 | 7/1987 | Cutright et al. | 361/415 |
| 4,654,820 | 3/1987 | Brahm et al. | 361/393 |
| 4,664,265 | 5/1987 | George, Jr. | 361/415 |
| 4,679,121 | 7/1987 | Schomers et al. | 361/393 |

Primary Examiner—Gareth D. Shaw
Assistant Examiner—Viet Q. Nguyen

[57] ABSTRACT

A backplane structure for a computer includes first and second spaced apart backplane sections each having a series of spaced, vertical connector assemblies for receiving edge connectors of a series of parallel spaced apart circuit boards in a vertical orientation. Spaced bus lines run horizontally across each backplane section for interconnecting appropriate pins of the respective circuit board connectors. One of the backplane sections receives circuit boards of the memory section of a computer, and the other section receives the computer functional unit boards. A third backplane section extends between the first and second sections and has a series of spaced horizontal connector assemblies for receiving connector edges of a series of circuit boards in a horizontal orientation. At least some of the horizontal connector assemblies receive circuit boards of the buffer section of a computer. Each horizontal buffer board connector assembly is connected at each end to a respective selected portion of the bus lines of the first and second backplane sections, respectively, so a connected buffer board can act as a bridge between these sections.

14 Claims, 6 Drawing Sheets

BACKPLANE STRUCTURE FOR A COMPUTER SUPERPOSITIONING SCALAR AND VECTOR OPERATIONS

BACKGROUND OF THE INVENTION

The present invention relates to a backplane structure for a computer incorporating bus lines for cummunication between various sections of the computer.

Most computers consist generally of a control section, a memory section for storage of data and program instructions, a buffer or register section for temporary data storage, and a functional unit section for performing operations. Communication between various parts of the computer and between the computer and peripheral devices takes place on one or more buses devoted to the transfer of data, addresses and control signals. The bus lines may be bi-directional or unidirectional. The use of a shared bus vastly simplifies interconnection of units but must be designed with care to avoid signal collision and interference problems.

In most computers the various circuit boards containing the computer components are mounted in card edge connectors on a suitable backplane, with lines running across the backplane to connect corresponding bus pins on all the cards for signal communication between the respective components. With computers of increasing size, speed and complexity the problems of interconnecting the various units are multiplied, with the numbers of lines required for signal transfer increasing in computers superpositioning scalar and vector operations to enormous numbers which are outside the range of present day high density card edge connectors. Thus the computer architect may find that the card edge connector has insufficient pins to provide the number of separate bus lines required. For example, the standard scalar machine with two to four 32-bit buses on a single backplane practically saturates the physical and electrical capabilities of the backplane; such a backplane is definitely insufficient for an architecture requiring the equivalent of eighteen 64-bit buses. Also, there is a minimum spacing allowable between adjacent bus lines below which interference can occur between the lines. Where large numbers of bus lines are needed for signal transfer there may be insufficient space available on the back plane to provide the necessary number of lines. Added to this is the fact that the line length is also limited by the speed of signal transfer necessary for the particular machine.

Some of these problems have been solved in the past by point to point wiring between the circuit boards, but this results in large machines with miles of wiring and resultant reduction in speed of data transfer. Manufacturing of point to point wiring is also a very slow and tedious operation, substantially increasing manufacturing costs of such machines and making production relatively slow. The backplane of such machines is a mass of wiring, difficult to install and maintain, as compared to the relatively easy assembly and maintenance of an integral bus backplane structure.

Recently, a category of computer has emerged that realizes highly efficient computing by provision of an architecture containing both scalar and vector capabilties. The integration of scalar and vector structures into a single construct is referred to as superposition. Superposition results in a computing machine that can use software compatible with existing scalar and vector systems to achieve the speed inherent in vector processing, while enjoying the precision and flexibiltiy of scalar processing.

Machines which superposition vector and scalar functions are referred to popularly as "super computers." The best example of this type of machine is found in the line of products available from Cray Research, Inc., Chippewa Falls, Minnesota. These computers superposition scalar and vector operations by employing concurrent scalar and vector processes to calculate, for example, starting and ending indices for vector data structures, and vector techniques to perform memory references and functional operations on the indexed vector structures.

Typically, a computer which superpositions scalar and vector operations has a main memory consisting of a plurality of interleaved individual memory units in which multiple units can be concurrently accessed by simultaneous processes for storage or retrieval. Superposition also requires the provision of a plurality of functional units, each for performing a specified arithmetic or logical function. Normally, the functional units have pipelined structures which permit them to receive a set of operands for one operation while still processing a set of operands for a previous operation. Such functional units can be used for vector operations, as well as for performance of floating point operations on scalar operands. Finally, the architecture of a superpositioning computer typically includes a bank of scalar and vector registers that act as buffers or caches between memory and functional units. the primary purpose of positioning buffer registers between memory and functional units is to reduce memory access time in scalar operations and to increase memory throughput in vector operations.

The Cray X-MP provides the most current example of a computer which superposes scalar and vector operations and which has an architecture including the elements previously discussed. In this machine, connectivity between the architectural blocks is provided on unidirectional data paths that are physically implemented using point-to-point wiring.

In the prior art, the interconnection technology of superpositioning computers has not incorporated the bi-directional databus. Such a databus structure in its present form is inapplicable to the superpositioning computer because it does not permit the scalar and vector processes to have independent, but concurrent, paths to and from memory. Such an independent memory data connection is necessary because it permits the scalar section to fully perform all index calculations without interfering with the concurrently-operating vector processes that require the indices. Further, the traditional bi-directional databus forces the memory, general purpose registers, and ALU of scalar machines to use the same data for data transfers, thus removing the buffers functionally and physically from between the memory and ALU. An architecture that does not contain independent data paths does away with the response time and throughput benefits provided by positioning scalar and vector registers between the memory and the functional units.

Thus, there is an evident need in the field of superpositioning computers to reduce the amount of physical resources required to support data interconnection, which need is not fulfilled by a traditional databus structure upon which all data transfers in a computer are made.

It is therefore the primary objective of the present invention to advance a backplane structure for use in a computer which superposes scalar and vector operations, which will reduce the physical dimensions of the data interconnection resources of the computer, yet which will retain the benefits of quick response time and efficient throughput realized by the computer's architecture.

It is also an object of the present invention to provide an improved backplane structure for interconnection of units in a computer superimposing scalar and vector operations.

SUMMARY OF THE INVENTION

The present invention is based on the observation that the provision of a pair of bi-directional databusing structures can be adapted to existing superpositioning computer architecture by providing a pair of independent bi-directional databus structures, one for connecting the main memory and buffer, and the other for connecting the buffer and functional units. Utilization of such a busing structure retains the desirable architectural arrangement of existing superpositioning computers while reducing the size and rationalizing the arrangement of their data interconnection structures.

According to the present invention a backplane structure is provided which includes first and second spaced apart backplane sections each having a series of parallel, spaced apart card edge connectors in a first orientation for receiving the connector edges of a series of circuit boards comprising the memory and functional unit sections, respectively, of a computer. A third or central backplane section extends between the first and second sections and has a series of spaced apart card edge connectors in a second orientation perpendicular to the first orientation for receiving the connector edges of a series of circuit boards at least some of which comprise the buffer section of the computer. The first and second backplane sections each have a pluarlity of parallel bi-directional bus lines running transversely to the edge connectors to interconnect the circuit boards in that section, and the outer edges of each buffer board connector in the third backplane section are connected to a respective selected portion of the bus lines of the first and second section, respectively.

Thus, a superpositioning computer employing the present invention can maintain the arrangement of a buffer section situated physically and functionally between respective main memory and functional unit sections. The backplane structure of the present invention locates the buffer section including vector, scalar, and address registers adjacent the central backplane section and locates the memory and functional unit sections adjacent the first and second spaced apart backplane sections.

In the preferred embodiment of the invention the outer backplane section connectors are arranged vertically, while the central backplane connectors are arranged horizontally. In this way, each horizontal buffer board is connected to each of the circuit boards in the memory and functional unit sections with a minimum length of bus line, and the bus lines do not have to extend across the entire backplane as is necessary in conventional constructions. The number of individual bus lines which have to connect to each card edge connector is reduced, making it possible to use bused interconnections and high density card edge connectors in a computer superimposing scalar and vector operations.

Because of the vertical arrangement of the boards in the memory and functional unit sections, and the horizontal arrangement of the boards in the buffer section, the buffer boards can be arranged to act as a bridge between the memory and functional units.

Each buffer board consists of various registers and signal path terminators are provided at opposite edges of the buffer board adjacent the opposite ends of the connector to which the board is connected. The signal path between the memory section and a particular buffer board will therefore extend from the appropriate memory boards along the horizontal bus lines connected to that buffer board, turn through 90 degrees and connect to the appropriate pins of the horizontal connector which connect to the adjacent signal path terminator of that buffer board. A similar signal path extends between the functional unit section and the opposite edge of the buffer board. Signals are then latched into the appropriate buffer board register for transfer to the memory or functional unit section according to the particular opertion being performed. A principal reason for this arrangement is that the buffer section, requires a large number of control signals, and these signals must be short. In this arrangement, the center portion of the buffer backplane is dedicated to a large number of short vertically transferred control signals.

In the preferred arrangement of the invention the three backplane sections are arranged in a line with the third section extending between the inner edges of the outer first and second sections. The backplane may be a continuous integral structure or comprise three separate sections suitably connected together at their adjacent edges. Preferably, the connectors on the first and second sections are arranged to mount the memory and functional unit boards on one face of the backplane, while the connectors in the third, central section are arranged to mount the buffer boards on the opposite face of the backplane. This leaves room for cooling equipment or additional components, for example, on opposite sides of the buffer section and in the space between the memory and functional unit section, and ensures that the circuit board support structure does not have to extend the entire length of the back plane.

Preferably, three bi-directional databuses are provided on the memory section backplane, comprising two vector buses and a scalar bus for transfer of vector and scalar quantities between the memory and buffer boards, and vice versa. Each bus has 72 lines, 64 data and 8 parity, and in the preferred embodiment of the invention the buffer boards are byte-sliced with the first 8 + parity bits of each memory bus connected to a first buffer board, the next 8 + parity lines of each bus connected to the second buffer board, and so on for the entire 72 lines of each bus. The functional unit buses are connected to the buffer boards in a similar manner, with the first 8 + parity lines of each functional unit bus connected to the first buffer board, the next 8 + parity lines to the next buffer board, and so on. The buffer board slices may correspond to other portions of data, such as 4 bits, 16 bits, and so on. The functional unit backplane in the preferred arrangement includes four buses of which two are bi-directional for transfer of results back to the buffer board registers. Extra buses may be provided for possible expansion of the system.

In a preferred arrangement of the invention some of the third backplane section connectors are adapted for connection to circuit boards containing the control section of the computer. These connectors are interconnected to each other and to the buffer board connectors via vertical control signal bus lines in the central area of the third backplane section, which is free since the memory and functional unit connections only extend to the opposite edges of the third backplane section.

Thus a compact backplane structure for a computer is provided which allows a large number of interconnections in a minimum length of bus line and is particularly suitable for a computer superimposing scalar and vector operations in which very high speed operation is necessary and thus only a minimum signal path length is effective.

BRIEF DESCRIPTION OF THE ACCOMPANYING DRAWINGS

The present invention will be better understood from the following detailed description of a preferred embodiment of the invention, taken in conjunction with the accompanying drawings, in which like reference numerals refer to like parts and in which.

Figure 2:
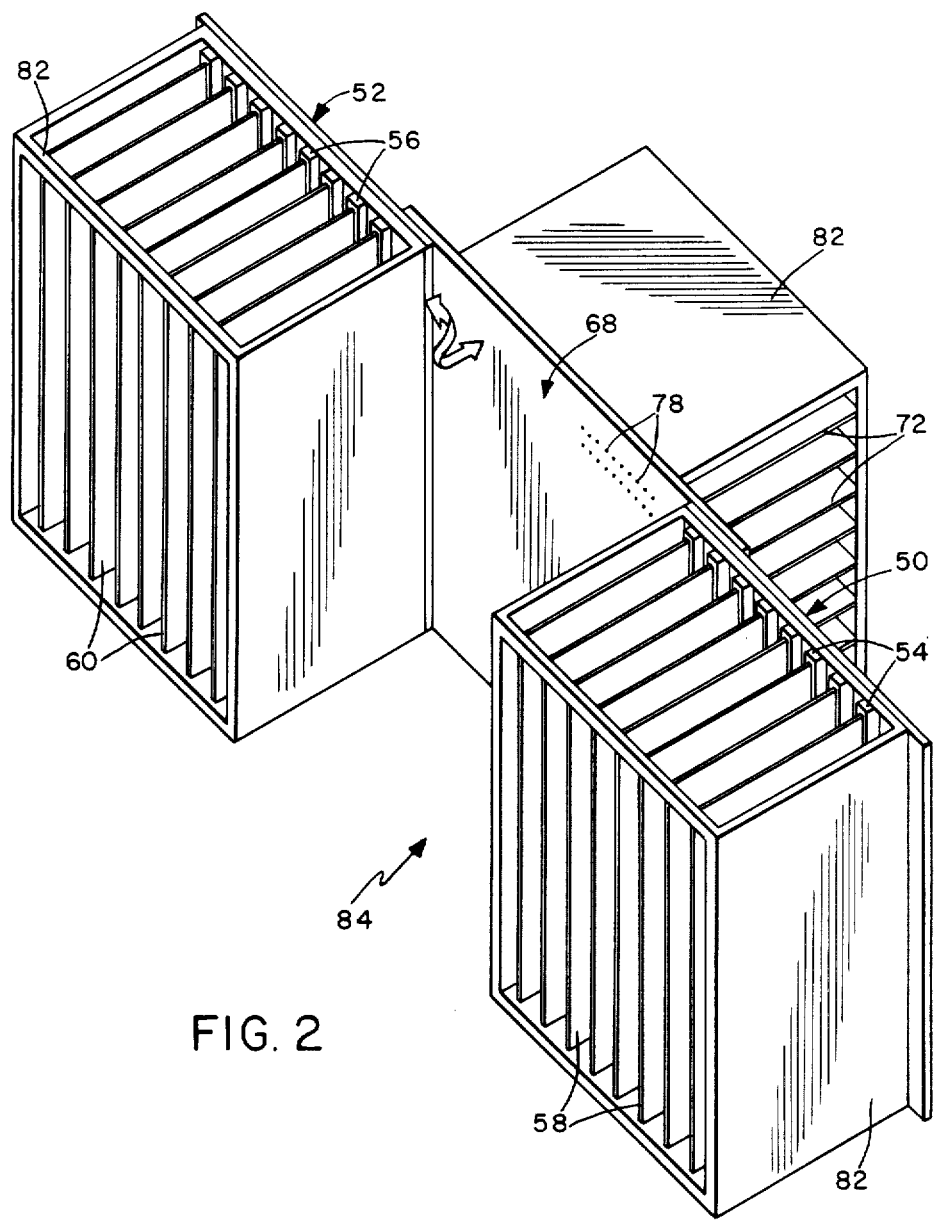
FIG. 2 is a perspective diagrammatic view of a backplane structure for mounting circuit boards containing the components of the system shown in FIG. 1 and interconnecting the various circuit boards along suitably arranged bus lines.
Figure 7:
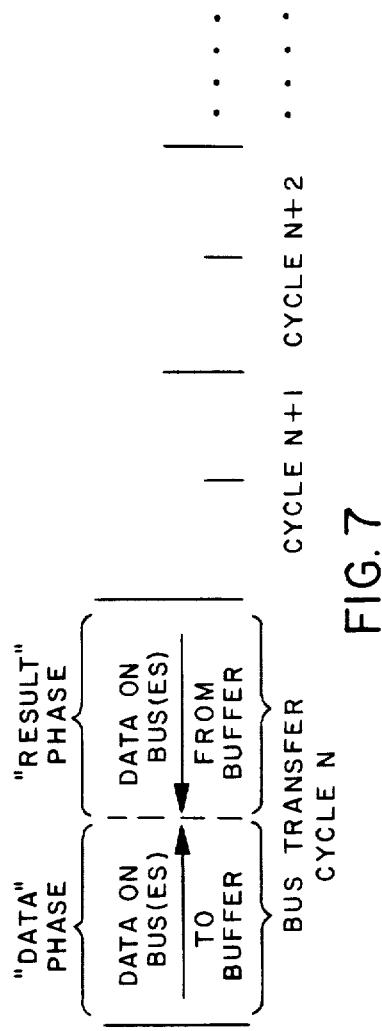
Figure 5:
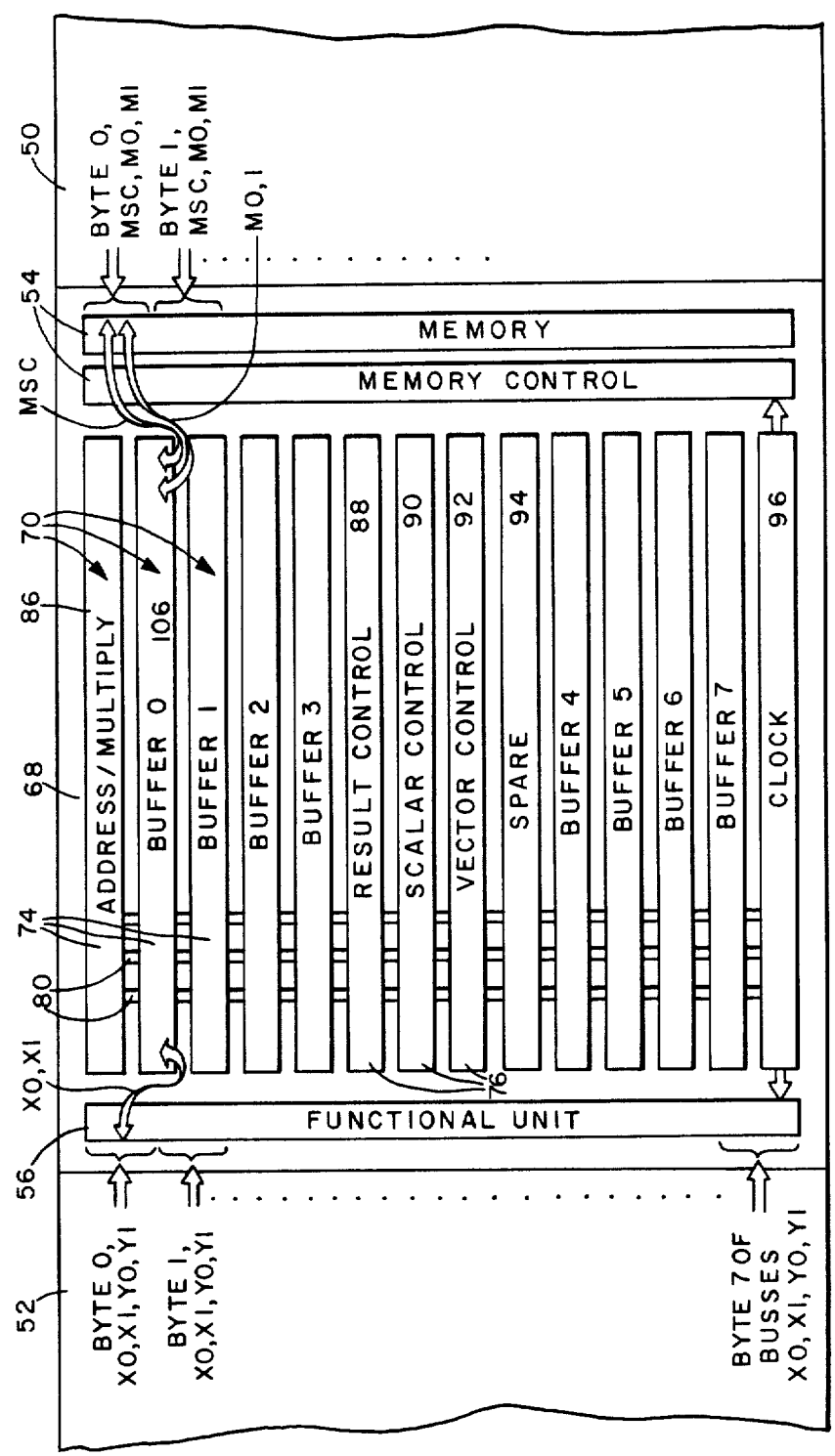
Figure 6:
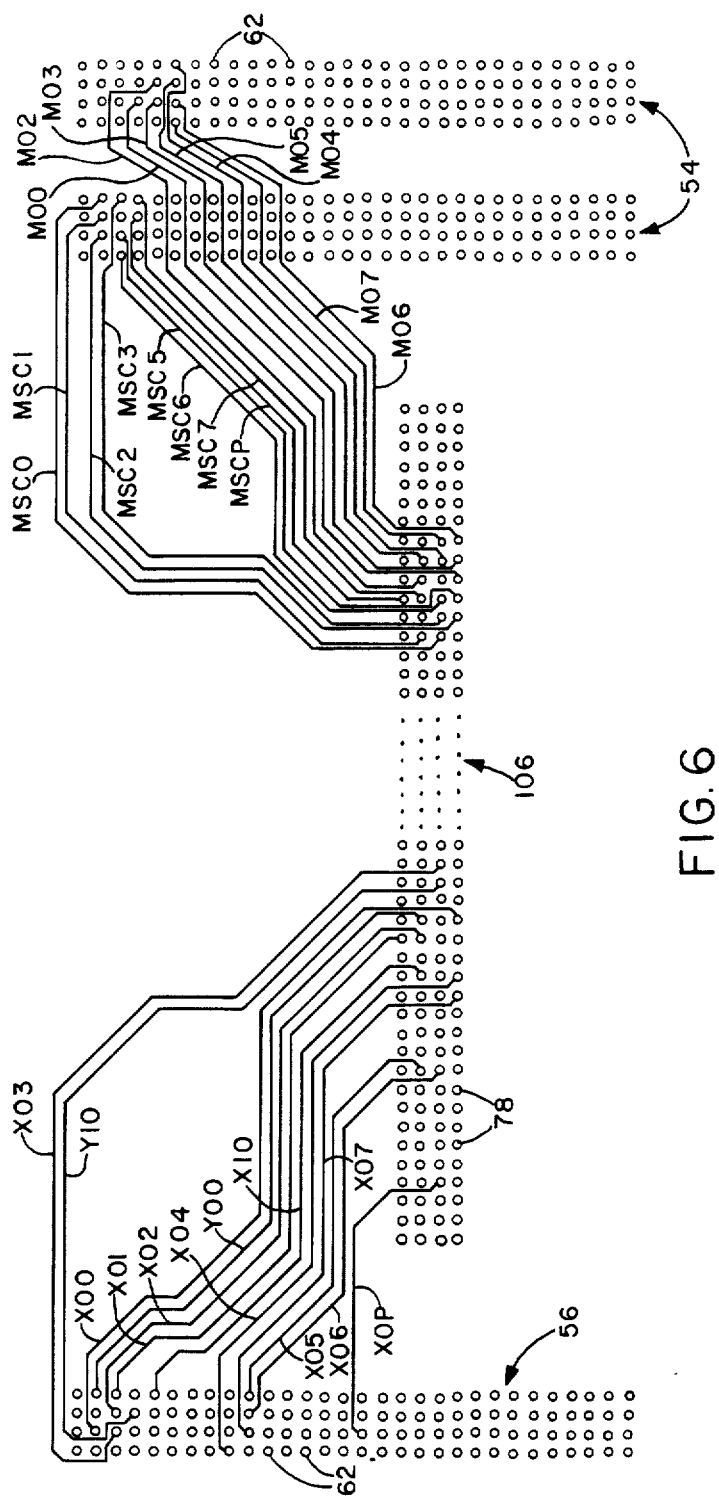

FIG. 5 is a schematic rear elevational view of the buffer section of the backplane structure of FIG. 2, showing the pin side of the connectors in that section; and FIG. 6 is a partial view showing the pins at each end of one of the buffer board connectors and representative lines connecting appropriate pins to one byte of the one of the functional unit and memory buses, respectively, and one bit of the other buses to show the bus line interleaving, FIG. 7 is a timing diagram illustrating a bus transfer cycle.

DESCRIPTION OF THE PREFERRED EMBODIMENT

Figure 1:
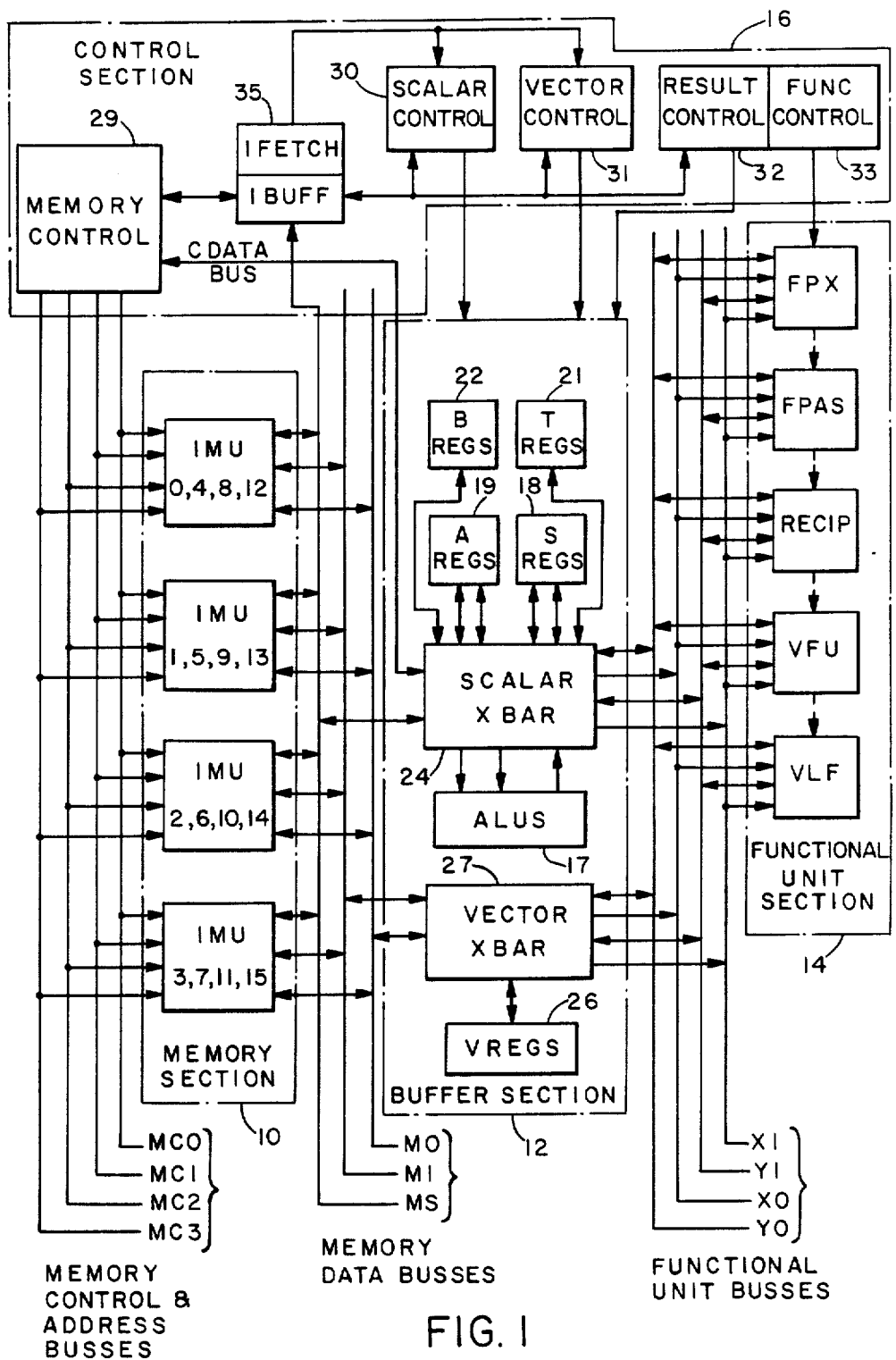
FIG. 1 is a block diagram of a computer which superpositions scalar and vector operations, showing how various bi-directional databuses interconnect the various units of the computer.

FIG. 1 is a block diagram showing a computer that superpositions scalar and vector operations as described in a co-pending application entitled "BI-DIRECTIONAL DATABUS SYSTEM FOR SUPPORTING SUPERPOSITION OF VECTOR AND SCALAR OPERATIONS IN A COMPUTER" filed on the same date as this application and assigned to the assignee of this application. The present application relates to a backplane structure which is suitable for interconnection in the computer shown in FIG. 1 and also in other computer systems where large numbers of bus lines would normally be necessary and where the length of such lines is limited by the speed of operation.

As shown in FIG. 1 the computer basically comprises a memory section 10 for storage of data and program instructions, a buffer section 12 for temporary data storage, a functional unit section 14 for data processing, and a control section 16 for control of signal transfer and operation of the various sections. Various buses interconnect the respective sections. The different sections are divided into a number of separate units, the memory including four memory units, the buffer having several scalar and vector registers for temporary storage of scalar and vector quantities, and the functional unit section having various units for performing different operations on data.

In the computer of FIG. 1, the main memory consists of four interleaved individual memory units (IMU's). Each addressable memory location contains a 64-bit data element or word. In the context of scalar processing, the basic scalar data object is understood to be a single 64-bit word. When vector processing is considered, each vector data object that is processed consists of from one to sixty-four 64-bit elements or words.

Vector logical and computation and floating point arithmetic operations are performed by respective units of the functional unit section 14. The functional units are conventional processors which perform specific arithmetic or logic functions. The architecture of the functional units is conventional and each consists essentially of a pipelined processor. Exemplary architecture and operations of pipelined functional units are known in the art.

The buffer section 12 is located functionally and physically between the main memory and the functional units. The purpose of the buffer section is to stage scalar data objects and vector data objects between the main memory and the functional units and to provide temporary storage of intermediate results of vector operations. Scalar and address functional units are also located in the buffer section in the block indicated by reference numeral 17. Such functional units principally comprise arithmetic and logic units (ALUs).

A set of scalar (S) registers 18 and a set of address (A) registers 19 are included in the buffer section. The S registers consist of a set of eight 64-bit registers. Similarly, there are eight 64-bit A registers. Scalar operations are supported by another set of T registers 21, while address operations are supported by a separate set of B registers 22. A scalar crossbar (XBAR) 24 provides for routing scalar data objects into and out of the S, A, T, and B registers.

The buffer section also includes a plurality of vector (V) registers 26, each capable of storing up to sixty-four 64-bit elements. A vector crossbar (XBAR) 27 provides for routing vector data objects to and from the V registers.

The functions of the V, S, A, B, and T registers correspond essentially to those of registers described in U. S. Pat. No. 4,128,880, incorporated herein by reference.

Control of memory, register, functional unit, and databus resources of the FIG. 1 computer is implemented by the control section 16, which includes a memory control unit 29, a scalar control unit 30, a vector control unit 31, a result control unit 32, and a functional control unit 33. An instruction unit 35 acts to cache and issue instructions. The structure and function of the individual units contained in the control section 16 can be understood by reference to the previously-identified patent application, which is incorporated herein by reference.

The invention concerns the support of a bi-directional busing system divided into two functional parts. The first functional part comprises a plurality of bi-directional memory databuses M0, M1, and MSC that interconnect the main memory and the buffer. Each of the memory databuses consists of sixty-four fully bi-directional data paths, and each is capable of conducting a 64-bit scalar or vector data element. The scalar memory databus MSC connects the main memory of the S, A, T, and B registers through the scalar crossbar 24. The vector memory databuses M0 and M1 transfer vectors between the main memory and the V registers 26 through the vector crossbar 27. The memory control unit 29 controls all vector, scalar, and instruction accesses to the memory section 10 over four memory control and address buses MC0-MC3. Each of the buses MC0-MC3 permits an independently-operating memory control processor in the memory control unit to conduct an independent memory reference process. These processes can also be understood by reference to the incorporated patent application.

The second part of the databus system which the invention concerns consists of a pair of functional databuses. Each of the functional databuses includes a pair of signal transfer paths. The first of these pairs is denoted as X0 and Y0 and the second as X1, Y1. Each of the X and Y signal transfer paths consists of a 64-bit wide data path capable of transferring a data element. The bus paths denoted by X are unidirectional and conduct words from the buffer section 12 to the functional unit section 14. The functional bus paths denoted by Y are bi-directional and conduct scalar and vector data objects in both directions between the buffer section 12 and the functional unit section 14.

As explained in the incorporated patent aplication, bus operations are synchronized by a bus interface clock, each cycle of which is termed a bus transfer cycle. Reference is given now to FIG. 7 where three bus transfer cycles, N, N+1, and N+2, are shown. Each bus transfer cycle is divided into two bus transfer phases of equal duration. During the first phase of a transfer cycle, data elements can be transferred from the buffer section 12 to the memory section 10 on buses M0, M1, and MSC, and to the functional unit section 14 on both paths of each functional bus. This is referred to as the "data" phase of a transfer cycle. During the second, or "result," transfer phase of a bus transfer cycle, data elements can be transferred to the buffer section 12 on the Y signal paths of the functional buses, and on all of the memory databuses. The time duration of a bus transfer cycle phase corresponds to the time for one data element to travel one way between one of the crossbars 24 or 27 and either the memory section 10 or the functional unit section 14.

In addition to the data and control signal transfer lines provided on the buses as described above, additional lines are required to supply power and ground connections to the computer components. One of these is a control (CDATA) bus. As is known, the number of lines required for power and ground is normally equal to about 20% of the number of signal transfer lines. Also, additional lines are normally provided in the system to allow for potential expansion. The problems in providing this many lines on a standard backplane can be understood from a brief consideration of the number of separate lines and connections required. High density backplane connectors which allow the edges of cards or circuit boards carrying components of various parts of a computer system to be plugged into the backplane presently have a maximum of 684 pins. To connect the memory, functional unit and control section buses to the buffer section of the system shown in FIG. 1 in a standard fashion would require connectors having more than 700 pins. Additionally, such a high density of bus lines extending across the backplane could give rise to signal interference and separation problems. Also, the system shown in FIG. 1 uses a 45 nanosecond clock, with the bi-directional buses having a 22.5 second minor clock. This means that the maximum bus length allowable to ensure signal transfer within the 22.5 second time period allowed before the next clock is 18 inches.

These "connectivity" problems can be solved with the backplane structure illustrated generally in FIGS. 2, 4, 5 and 6. According to the preferred embodiment of this invention the backplane is divided into three sections. The first and second ("outer") sections 50 and 52 each have a series of vertical spaced card edge connectors 54, 56, respectively, for mounting a series of circuit boards 58, 60 in a first, vertical orientation across the two backplane sections. In the preferred embodiment, each connector is a high density connector. Pins 62 in each of the connectors (see FIGS. 4 and 6) connect to appropriate connectors in the edge of each mounted circuit board, and extend through to the opposite face of the backplane. The connection of each pin to the appropriate circuit board connector is of the standard pin and socket type as is well known in the computer and electronic assembly field.

Figure 4:
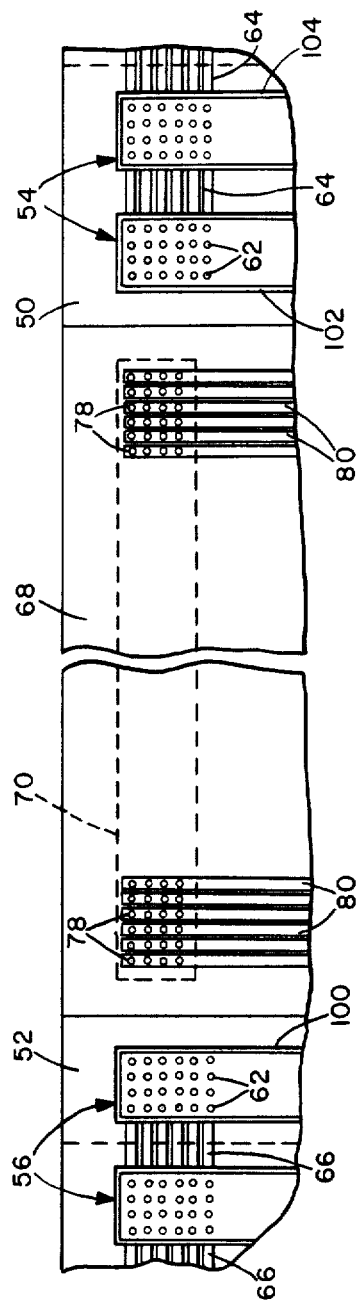
FIG. 4 is a partial front elevational view of the backplane with the circuit boards removed to show the arrangement of the vertical pin connectors and horizontal bus lines in the outer backplane sections.

Horizontal bus lines 64, 66 respectively, run across each of the two backplane sections as indicated generally in FIG. 4 to connect the pins of each circuit board connector to appropriate pins of all of the other circuit board connectors in that section, for interconnection of the appropriate corresponding components on each circuit board in the standard fashion. In the preferred embodiment of the invention shown in the drawings, the backplane sections are each multi-layer with bus lines being provided on each outer layer for further separation of the individual lines. The pins project through all of the layers of each section to connect to appropriate lines on each face of the backplane. However this construction is not essential and a single layer backplane or internal backplane layer busing may be used in alternative embodiments of the invention.

The circuit boards 58 mounted in the first backplane section comprise the memory section of the computer shown in FIG. 1, with the innermost board preferably comprising or including the memory control unit. The circuit boards 60 mounted in the second backplane section comprise the functional unit section of the computer shown in FIG. 1. Thus the bus lines running horizontally along the first backplane section correspond to the three memory databuses and four memory control buses shown in FIG. 1, and the necessary power and ground lines for the components. Similarly, the bus lines running horizontally across the second backplane section correspond to the four functional unit databuses and the functional unit control bus shown in FIG. 1, as well as the necessary power and ground lines. Clearly of greater or lesser number of data and control buses may be provided in alternative arrangements, and one or two unused buses are preferably provided in each backplane section for potential expansion purposes.

The outer first and second backplane sections are separated by a third, central backplane section 68 which is arranged to mount circuit boards comprising the buffer and control sections of the computer in a second, horizontal orientation perpendicular to the outer section boards. Thus the third section has a series of horizontal card edge connectors 70 mounted on the opposite face of the backplane to the vertical connectors 54,56 in the outer two backplane sections as indicated generally in FIGS. 2 and 4. Each horizontal connector extends between opposite edges of the central backplane section adjacent the memory section and functional unit section, respectively, and a circuit board 72 mounted in that connector can be designed to act as a bridge between the memory and functional unit boards, as described in more detail below in connection with FIG. 3.

A series of spaced horizontal circuit boards 72 are mounted in the horizontal connectors 70 of the central backplane section on the opposite face of the backplane to the memory and functional unit boards, as shown in FIG. 2. These boards comprise buffer boards 74 and control boards 76 providing the buffer and control sections of the computer shown in FIG. 1, as indicated generally in FIG. 5. The pins 78 of connectors 70 extend through the backplane section 68 and vertical bus lines 80 (indicated schematically in FIGS. 4 and 5) on the backplane section 68 interconnect appropriate pins of the connectors 70 to provide the buffer control busing illustrated in FIG. 1.

As shown in FIG. 2, the three backplane sections are preferably provided in a line with the memory and functional unit boards mounted on the opposite face of the backplane to the buffer and control boards. A suitable standard card-cage like support frame 82 is provided for each backplane section to support the stack of circuit boards or cards in that section in a spaced, parallel arrangement. By providing the central section boards on the opposite face to the outer section boards, the support frame structure does not have to extend along one face of the backplane, which would add extra length to the backplane and thus also to the bus lines, and spaces 85 are left on each side of the buffer and control section and between the memory and functional unit sections for mounting of peripheral devices, cooling units and the like, making the overall structure significantly more compact than conventional designs. The entire structure may be enclosed in a suitable housing (not shown).

The interconnections between the memory, buffer, control and functional unit sections will now be described in more detail with reference to FIGS. 2, 4, 5 and 6.

As can be seen from FIGS. 2, 4 and 5, the three backplane sections are separate with their adjacent edges overlapped and bolted together with the pins of the innermost functional unit connector 100 extending through the overlapping portions of the functional unit and buffer backplane sectons, and the pins of the innermost two memory board connectors 102, 104 also extending through overlapping portions of the memory and buffer backplane sections. In an alternative embodiment, the backplane sections could be formed as a single, continuous backplane with appropriate positioning of the memory, buffer, control and functional unit connectors. The view in FIG. 4 is from the connector side of the memory and functional unit backplane sections, and the view in FIG. 5 is from the connector side of the buffer backplane section, with the circuit boards removed for clarity. Either one of the innermost two memory board connectors may be used for mounting of a memory control board.

FIG. 5 shows how each of the horizontal connectors 70 extends between the innermost functional unit and memory board connectors. Connections or connecting lines are provided as necessary between the innermost functional unit connector and the adjacent ends of the buffer board and control connectors to provide the functional unit databuses between the functional units and the buffer section of the computer as shown in FIG. 1, and to provide the functional unit control busing indicated in FIG. 1. These connecting lines are indicated schematically in FIG. 5 and more precisely for one byte of data of a functional unit bus in FIG. 6, as described in more detail below.

Similarly, connecting lines extend between the innermost memory connectors and memory control connector and the adjacent ends of the horizontal buffer board and control connectors, to provide the memory data and control data busing indicated in FIG. 1.

It can be seen that these connecting bus lines only need to be relatively short since each buffer and control board connector has its opposite ends positioned adjacent the innermost memory and functional unit connectors, respectively, to which all of the internal memory and functional unit buses are connected. Thus the connecting lines only have to connect appropriate pins of the innermost connectors of the functional unit and memory sections to appropriate corresponding pins of the adjacent ends of selected buffer and control board connectors, as shown in FIG. 6 and described in more detail below.

In the preferred embodiment of the invention, the buffer section of the computer is byte-sliced, with each buffer board connected to receive a respective byte of data from the appropriate memory and functional unit bus lines. Thus each buffer board does not have to be connected to every memory and functional unit bus line, significantly reducing the connectivity problems.

In the preferred arrangement illustrated generally in FIG. 5, the buffer board connectors for buffer boards processing successive bytes of data are provided in upper and lower portions of backplane section 68, and the control board connectors are provided in the central portion. In the arrangement of FIG. 5, the uppermost connector 86 is for connection to an address/multiply board and the next four connectors are for connection to buffer boards for receiving bytes 0 to 3, respectively, of data from the memory and functional unit buses. The next three connectors 88, 90 and 92 are for mounting the result, scalar, and vector control boards, respectively (See FIG. 1). Connector 94 is a spare to allow for possible expansion. The next four connectors are for connection to the buffer boards for receiving bytes 4 to 7, respectively, of data, and the lowermost connector 96 is for mounting a clock control board. Vertical control busing 80 for interconnecting all these boards is indicated schematically in FIG. 5, and comprises the scalar, vector and result control busing indicated in FIG. 1 as well as any other control busing required. Spare control buses are preferably also provided to allow for potential expansion of the system.

Clearly alternative arrangements of buffer and control boards may be used, as is convenient for providing the bus interconnections, and the buffer boards need not be byte sliced but may be arranged to receive alternative length data slices such as multiples or sub-multiples of one byte, with corresponding decrease or increase in the number of buffer boards.

Because of the byte or data-slicing of the buffer boards, it is not necessary for every line of every memory or functional unit databus, for example, to connect to every buffer board connector. All that is required to interconnect the memory and buffer sections is that the lines corresponding to each successive byte or slice of data which may be as small as one bit on each bus are connected to the appropriate buffer board connector for that particular data byte or slice.

To further reduce the signal path length, to prevent any signal line crosstalk, and to improve signal path routability, bus lines of all of the buses are interlaced. As a result of interlacing, lines corresponding to bits 0 to 7 of each of the memory buses M0, M1, and MSC are located in a section of the memory backplane at or adjacent the level corresponding to the type 0 buffer board connector (BUFFER 0 in FIG. 5), bits 8 to 15 of each bus are located as close as possible to the level of the byte 1 buffer board connector (BUFFER 1), and so on down to the final eight bits of each bus which are located at or adjacent the level of the lowermost, byte 7, buffer board connector (BUFFER 7). Similar principles also apply to the functional unit buses, which have lines corresponding to equivalent bytes of data also interleaved to be adjacent the level of the appropriate buffer board. This interlacing of the buses is schematically indicated by the horizontal arrows in FIG. 5. The bus lines may, if necessary, be further separated by making the backplane in several layers, as is known in computer backplane design, and having appropriate bus lines in different layers to allow for further separation and crossovers in separate layers. However, for simplicity in this description, the backplane is shown as having one layer only.

FIG. 6 illustrates the connection of lines corresponding to byte 0 of the functional unit bus X0 and the memory buses MO and MSC to appropriate pins at the respective adjacent ends of the byte 0 buffer board connector 106. Also shown in FIG. 6 is byte 0 of each of the other functional unit buses to indicate how the buses are interlaced. It will be understood that the lines carrying the other bits of byte 0 of all the buses will be interlaced with the lines shown in FIG. 6 in a similar fashion, with the interconnecting lines arranged to avoid crossovers (unless they are in different backplane layers) and to maintain greater than the predetermined allowable minimum spacing between adjacent lines to avoid signal interference.

In the left hand side of FIG. 6, the connecting lines between corresponding pins 62, 78 of the innermost, vertical functional unit connector 100 and the byte 0 buffer board connector for the XO bus are shown. Thus X00 is the connecting line for bit 0 of byte 0, X01 is the connecting line for bit 1, and so on to X07 which is the connecting line for the final bit 7 of byte 0. X0P is the X0 parity bus. Y00, X10 and Y10 are the connecting lines for bit 0 of the Y0, X1 and Y1 buses, respectively.

The horizontal bus lines corresponding to these bits of data run across the functional unit backplane section to the appropriate pins of the innermost connector. The connecting lines X00-X07, Y00-Y07, X10-X17, and Y10-Y17 extend from the appropriate corresponding pins generally transverse to the vertical connector 100, then are directed through one or more turns or angled sections as indicated in FIG. 6 until they have turned through an effective overall angle of 90 degrees and are directed transverse to the horizontal byte 0 buffer board connector at appropriate relative horizontal positions for connection to the appropriate buffer board connector pins. It will be understood that the arrangement of the connecting lines in FIG. 6 is only one of many possible arrangements to turn all the signal paths simultaneously and bring them into line with the appropriate connector pins. Thus the connector pins and connecting lines are allocated by the designer in the manner allowing for maximum utilization of the available space with minimum length of individual lines to reduce signal transition times.

The right hand side of FIG. 6 shows a similar type of arrangement for connecting the innermost two memory board connectors to the byte 0 buffer board connector. FIG. 6 shows bits 0 to 7 of the M0 (vector) and MSC (scalar) bus, indicated as M00-M07 and MSC0-MSC7, respectively. Again, the horizontal internal memory transfer lines for carrying these bits of data (not shown in FIG. 6) will connect to the appropriate memory connector pins. The other byte 0 lines of memory bus M1 (not shown) will be interlaced with the illustrated lines in any convenient fashion or, where the backplane is multilayer, may be provided in a different backplane layer as desired. The lines connecting the innermost memory connectors to the byte 0 buffer board connector again translate from the horizontal direction into the vertical direction with the relative horizontal positioning of the individual rotated lines being arranged such that they can connect to the appropriate buffer board connector pin without crossing over or approaching too closely to any other line. As mentioned above, if the lines in a single backplane layer would become too over-crowded to achieve this, the backplane may be made in a multilayer construction to allow further separation.

The other memory data and control databus lines not shown are connected to the appropriate buffer and control board connector pins in a similar fashion, as are the other functional unit data and functional unit control lines not specifically shown in the drawings. Thus, for example, the control databus CDATA of FIG. 1 will be connected from the memory control connector to the appropriate buffer board connector pins.

It can be seen that the memory and functional unit to buffer connections only take up a small portion of the outer edge of each buffer board connector, leaving the majority of the pins free for the vertical control busing.

Preferably, spare bus lines are provided for potential later expansion purposes. Thus, an X2 and Y2 bus may be provided between the functional unit and buffer section in a similar fashion, as well as an M2 memory bus.

It can be seen that the byte slicing and interleaving of the buses, that each buffer board extends between the memory and functional unit sections in a plane perpendicular to the memory and functional unit boards, allows the number of necessary interconnections to be reduced and the data path length to be minimized.

Although in the embodiment described the memory and functional unit connectors are shown as vertical with the buffer board connectors horizontal, other orientations are possible as long as the buffer board connectors are perpendicular to the rest of the connectors and extend between them. Thus the overall backplane structure of FIG. 2 may be rotated through 90 degrees with the successive backplane sections stacked one on top of the other, so that the buffer and functional unit connectors would extend horizontally and the buffer board connectors would extend vertically.

The signal path from the buffer board connector pins into each buffer board will now be described in more detail with reference to FIG. 3. Data from a selected memory board will be transferred from the board onto the appropriate horizontal memory bus, and will travel to the innermost memory connector and be transmitted via the interconnecting lines onto the appropriate buffer board connector pins.

Figure 3:
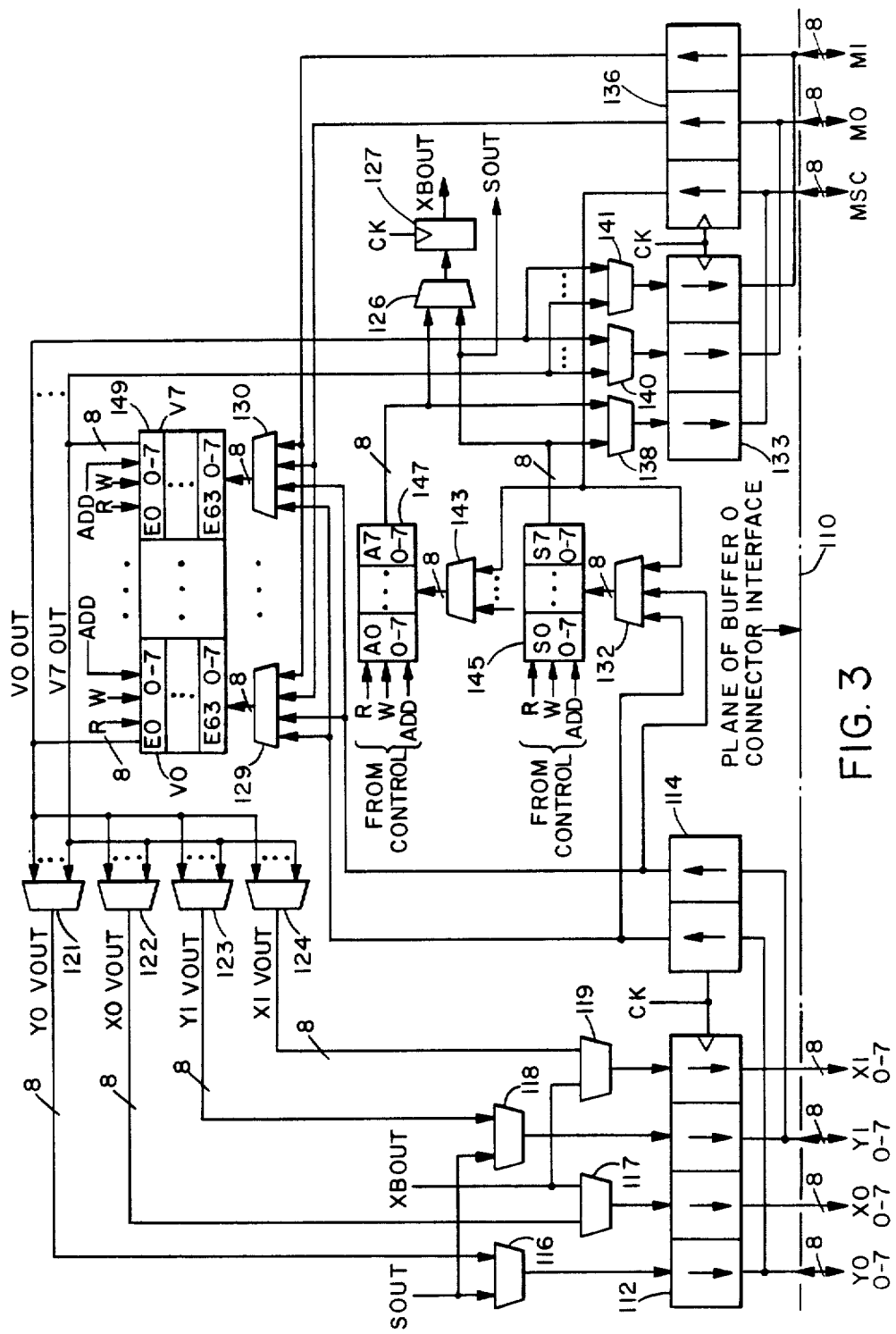
FIG. 3 is a hybrid illustration including a plan view of a buffer board and a schematic diagram of the components mounted on the buffer board.

As can be seen with reference to FIG. 3, the backplane structure of the invention permits for efficient and rational layout of the buffer boards 0-7. FIG. 3 represents a portion of the signal path layout of buffer 0, however, it is understood that it is also representative of corresponding portions of the layouts of buffers 1-7. In FIG. 3, the plane of the buffer 0 connector interface with the central portion of the backplane is indicated by the line 110. Here, the operand and result buses are terminated at the left end of the interface plane 110, while the memory buses terminate at the right-hand side of the interface 110. The operand bus termination includes a bank of latches 112 for providing respective bytes of data to the signal paths of the operand buses. This interface also includes a pair of registers 114 that latch bytes from the result buses Y0 and Y1. Signal routing to the latches 112 is provided through four 2-to-1 multiplexers 116-119. The multiplexers 116-119 select either a vector or scalar/address register source for the signal paths of the operand buses X0Y0 and X1Y1. Selection of a particular vector register as an operand bus source is effected by four 8-to-1 multiplexers 121-124. Another multiplexer 126 selects either an S or an A register to provide a byte of data onto the X data paths of the operand buses. The output of the multiplexer 126 is clocked through a register 127. Conduction of data from the result buses Y0 and Y1 through the registers 114 is provided to the byte slice of the vector registers residing on buffer 0 through eight 4-to-1 multiplexers, two of which are indicated by 129 and 130. Provision of data to be written from a result bus to a scalar register is implemented through the multiplexer 132. The memory buses are terminated adjacent the connector interface 110 by a bank of latches 133 which direct data onto the memory databuses. A bank of registers 136 latches data from the memory buses for provision to the S/A or V registers. Scalar data is routed from an S or an A register onto the MSC databus by way of a multiplexer 138. Vector data destined for memory is routed onto the M0 and M1 vector databuses through the 8-to-1 multiplexers 140 and 141, respectively. Data flowing from the memory section to the buffers on the MSC databus is routed to an S or an A register through the multiplexers 132 and 143, respectively.

The register circuitry on buffer 0 includes the first byte of each of the eight S registers represented by the block indicated by reference numeral 145. Thus, the block contains the first byte of the register S0, denoted in FIG. 3 as $S0_{0-7}$. Similarly, block 147 represents the first byte of each of the eight A registers. Both the S and A registers are conventionally implemented using random access memory (RAM) technology that is read from and written to by the provision of conventional read (R), write (W), and address (ADD) signals. The first byte of each element of the eight vector registers is represented by the block 149. Each block consists of a respective, separately controlled RAM device having the capacity to store the first eight bits of up to sixty-four elements of a respective V register. Thus, the portion of the block 149 indicated by V0 represents the first eight bits (0-7) of the sixty-four possible elements E0-- E63 that can make up a vector stored in V0. Data reference operations conducted against each of the vector register RAM circuits is conventionally implemented by R, W, and ADD signals.

Control of the signal routing through the multiplexers of FIG. 3 results from provision of path select signals from the vector, scalar, and result control units of the control section 16, depending upon the data transfer requirements. The read and write controls for the S/A and for the V registers are produced by the scalar and result control and the vector control units, respectively.

Thus, it can be appreciated that the backplane structure of the invention affords a compact, rational buffer layout providing an effective functional bridge between the memory and functional unit sections of the computer of FIG. 1. As is desirable, the buffer positions the S, A, and V registers between the memory and functional data paths of the computer. Further, the backplane structure, in permitting the control units directly affecting the vector registers to be located in the central portion of the backplane, provides a very effective means for physically and electrically isolating the memory databuses, the functional databuses, and the vector register control signals.

Thus, this invention reduces the problems of high density connectivity in complex computer systems and significantly reduces the connecting line length required to provide the necessary signal paths, increasing speed and allowing high speed vector and scalar operations in a parallel processing system. The backplane structure is much simpler, and both easier and faster to construct, than previous machines of this type which generally required several miles of point to point wiring. A compact backplane structure has been provided, which allows manufacture of computers superimposing scalar and vector operations to be significantly less costly and lengthy.

Although a preferred embodiment of the invention has been described above by way of example, it will be understood by those skilled in the field that modifications may be made to the disclosed embodiment without departing from the scope of the invention, which is defined by the appended claims.

I claim:

1. A backplane structure for a computer, comprising;
    first and second spaced apart, coplanar backplane sections, each having a series of spaced parallel connector assemblies in a first orientation for mounting a series of parallel spaced circuit boards, and a series of parallel bus lines running transversely to the connector assemblies for interconnecting corresponding points of said connector assemblies;
    a third backplane section substantially parallel to said first and second backplane sections, said third backplane section extending between said first and second sections and having a third series of spaced parallel connector assemblies in a second orientation perpendicular to said first orientation for mounting a further series of parallel spaced circuit boards in planes perpendicular to the circuit boards in first and second sections and parallel with the bus lines in those sections, each of the third section connector assemblies extending across said third backplane section between said first and second backplane sections with opposite end portions of said third section connector assemblies adjacent said first and second backplane sections, respectively; and bus connecting means in said first, second, and third backplane sections for connecting selected ones of said bus lines in said first and second backplane sections, respectively, to respective adjacent opposite end portions of selected ones of said third backplane section connector assemblies.

2. The structure of claim 1, wherein said connector assemblies of said first and second backplane section are vertical and said connector assemblies of said third backplane section are horizontal.

3. The structure of claim 1, wherein said third backplane section overlaps said first and second backplane sections and each of said first and second series of connector assemblies extends from an innermost connector assembly relatively nearer to said third backplane section than the rest of said series, said innermost connector assemblies being located where said third backplane section overlaps said first and second backplane sections, and said bus connecting means comprises bus connecting lines extending between the innermost connector assemblies of the first and second backplane sections and adjacent end portions of said selected third backplane section connector assemblies.

4. The structure of claim 1, wherein said connecting means comprises means for turning the signal path between each of said first and second backplane sections and the third backplane section through 90 degrees from a direction transverse to the first and second connector assemblies to a direction transverse to the third section connector assemblies.

5. The structure of claim 1, wherein said three backplane sections are connected in a staggered linear configuration to form a continuous linear backplane assembly in which said third backplane section overlaps and parallely abuts said first and second backplane sections.

6. The structure of claim 5, wherein said first and second backplane section connector assemblies are provided on the opposite face of said continuous linear backplane assembly to said third backplane section connector assemblies.

7. The structure of claim 1, wherein said first backplane section connector assemblies comprise means for mounting circuit boards comprising the memory section of a computer and said first backplane section bus lines include memory data buses of the computer, said second backplane section connector assemblies comprise means for mounting circuit boards comprising the functional unit of a computer and said second backplane section bus lines include the functional unit buses of the computer; and said third backplane section connector assemblies include buffer board connectors for mounting circuit boards comprising the buffer section of a computer and control board connectors for mounting circuit boards comprising the control section of a computer, said third backplane section having a series of parallel control bus lines extending transverse to said buffer and control board connectors for interconnecting said buffer and control circuit boards.

8. The structure of claim 7, wherein each of said buffer section boards corresponds to a selected portion of data from said memory and functional unit buses, and said bus connecting means comprises means for connecting selected bus lines of said memory and functional unit buses corresponding to said respective selected portions of data to respective selected ones of said buffer board connectors at areas adjacent to said first and second backplane sections, respectively.

9. The structure of claim 8, wherein said buffer boards are byte-sliced, and said bus connecting means comprises means for connecting lines of each memory and functional unit bus corresponding to a byte of data to a respective buffer board connector.

10. The structure of claim 8 wherein the lines of the memory buses are interleaved, such that lines corresponding to equivalent bytes of data are adjacent one another on the first backplane section, and the lines of the functional unit buses are interleaved, such that lines corresponding to equivalent bytes of data are adjacent one another on the second backplane section.

11. The structure of claim 8, wherein said bus connecting means comprises means for changing the disposition of bus lines corresponding to each selected portion of data from an orientation transverse to said first and second backplane section connector assemblies into an orientation transverse to said buffer board connectors for connection to the corresponding selected buffer board connector.

12. The structure of claim 8, wherein each buffer board has a buffer board connector interface with two opposite ends and includes a memory signal path terminator adjacent a first one of said ends for connection to a part of a selected buffer board connector adjacent the first backplane section, and a functional unit signal path terminator adjacent the second of said ends for connection to a part of the selected buffer board connector adjacent the second backplane section, said bus connecting means comprising means for connecting memory and functional unit bus lines corresponding to sequential portions of data to the memory and functional unit signal path terminators of respective buffer boards for processing the corresponding portion of data.

13. The structure of claim 7, wherein said memory buses are bi-directional and include at least one vector bus and two scalar buses, and said functional unit buses include at least four buses, at least two of which are bi-directional.

14. A system interconnection structure for a computer comprising:
first planar mounting means for mounting a first series of circuit boards comprising the memory section of a computer in spaced parallel relationship;
second planar mounting means coplanar with and spaced from said first mounting means for mounting a second series of circuit boards comprising the functional unit section of a computer in spaced parallel relationship parallel to the first series of circuit boards;
third planar mounting means parallel with, extending between, and overlapping the first and second mounting means for mounting a third series of circuit boards comprising a buffer unit section of a computer which buffers data between said first and said second mounting means, said third series of circuit boards mounted in a spaced parallel stack substantially at right angles to the first and second series of circuit boards with each of the third series of circuit boards extending between the first and second series of circuit boards;
first and second sets of bus connecting lines extending transversely across the first an second series circuit boards, respectively, for providing selected interconnections between the circuit boards in that series; and
bus connecting means for connecting the first and second set of bus connecting lines to selected ones of the third series of circuit boards, comprising means connecting selected successive groups of bus connecting lines of each set to selected successive ones of said third series of circuit boards.

* * * * *

UNITED STATES PATENT AND TRADEMARK OFFICE
CERTIFICATE OF CORRECTION

PATENT NO.   : 4,777,615

DATED        : October 11, 1988

INVENTOR(S)  : HANAN POTASH

It is certified that error appears in the above-identified patent and that said Letters Patent is hereby corrected as shown below:

Please add after field [76] on the patent coversheet:

--[73] Assignee:   Scientific Computer Systems Corporation
                   San Diego, California--

Signed and Sealed this

Twenty-fourth Day of October, 1989

Attest:

DONALD J. QUIGG

Attesting Officer

Commissioner of Patents and Trademarks